United States Patent [19]

Jürgensen et al.

[11] Patent Number: 4,991,540

[45] Date of Patent: Feb. 12, 1991

[54] QUARTZ-GLASS REACTOR FOR MOCVD SYSTEMS

[75] Inventors: Holger Jürgensen; Meino Heyen, both of Aachen, Fed. Rep. of Germany

[73] Assignee: Aixtron GmbH, Fed. Rep. of Germany

[21] Appl. No.: 334,109

[22] PCT Filed: Jun. 30, 1988

[86] PCT No.: PCT/DE88/00397

§ 371 Date: Feb. 24, 1989

§ 102(e) Date: Feb. 24, 1989

[87] PCT Pub. No.: WO89/00212

PCT Pub. Date: Jan. 12, 1989

[30] Foreign Application Priority Data

Jun. 30, 1987 [DE] Fed. Rep. of Germany ....... 3721636

[51] Int. Cl.$^5$ ............................................. C23C 16/00
[52] U.S. Cl. ..................................... 118/715; 118/719; 118/728; 118/733
[58] Field of Search ................ 118/50, 715, 719, 725, 118/728, 733; 427/248.1

[56] References Cited

U.S. PATENT DOCUMENTS

| | | | |
|---|---|---|---|
| 3,750,620 | 7/1973 | Eversteijn et al. ................... | 118/725 |
| 4,081,313 | 3/1978 | McNeilly et al. ................... | 118/725 |
| 4,266,507 | 5/1981 | Satoh ................................... | 118/733 |

FOREIGN PATENT DOCUMENTS

| | | | |
|---|---|---|---|
| 55-52222 | 4/1980 | Japan ................................... | 118/715 |
| 55-110033 | 8/1980 | Japan ................................... | 118/715 |
| 57-43411 | 3/1982 | Japan . | |
| 58-175823 | 10/1983 | Japan ................................... | 118/715 |
| 61-58893 | 3/1986 | Japan . | |
| 62-85424 | 4/1987 | Japan ................................... | 118/715 |

Primary Examiner—Norman Morgenstern
Assistant Examiner—Terry J. Owens
Attorney, Agent, or Firm—Evenson, Wands, Edwards, Lenahan & McKeown

[57] ABSTRACT

A reactor for MOCVD systems, having a reaction vessel through which the reacting gas or gases flow and in which the substrates are arranged in such a manner that a main surface is approximately parallel to the flow direction. The reaction vessel is made of quartz-glass and has, at least in the region in which the reacting gas flows, a rectangular cross-section. A flange element is provided at the gas-entrance-side end of the reaction vessel, while a protective tube surrounds the reaction vessel. The protective tube is provided with a face-end reactant gas inlet connected with a flange element to which the flange element of the reaction vessel can be flanged. The protective tube has a protective gas inlet in its superficies, which permits purging the space between the reaction vessel and the protective tube, and a reactant gas outlet. The reactant gases are deflected in the reaction vessel and exit through the superficies of the reaction vessel. A diffusion barrier is provided at the end opposite the gas-entrance-side end of the reaction vessel.

11 Claims, 1 Drawing Sheet

QUARTZ-GLASS REACTOR FOR MOCVD SYSTEMS

DESCRIPTION

Background of the Invention

The present invention relates to a reactor for MOCVD (metal oxide vapor deposition) systems having a reaction vessel, through which the reactant gas or gases flow and in which the substrates are arranged in such a manner that a main surface is approximately parallel to the flow direction.

State of the Art

The problem, in general, with the known reactors hereto is that a diffusion boundary layer forms between the reactant gas flow and the substrates, the distance of which increases from the substrate surface with increasing distance from the entrance side end of the reaction vessel. By this means the uniformity of the produced layers is diminished.

In accordance with the present invention, it was discovered that the problem with the diffusion boundary layer, the distance of which increases in the flow direction, can be solved by having the reactant gases flow past the substrates with high flow velocity. A boundary layer is yielded by this means that runs practically parallel to and at a little distance from the main surface of the substrates.

Furthermore, low pressure in the range between 10 and 1000 mbar should be worked with in order to keep the material use at a minimum.

However, an inventive element is that it was discovered that raising the flow velocity and, if required, lowering the overall pressure does not suffice in the prior art reactors having a round cross-section as vortices, etc., occur in the known reactors which hinder the formation of uniform mixed crystal layers.

DESCRIPTION OF THE INVENTION

The object of the present invention is to improve a reactor for MOCVD systems having a reaction vessel, through which the reactant gas or gases flow in which the substrates area is arranged in such manner that a main surface is approximately parallel to the flow direction, in such a way that uniform flow conditions are obtained with high flow velocities and, if required, low pressure without demanding complicated and elaborate equipment.

An inventive feature is that the reaction vessel is made of quartz-glass in an as such known manner and has a rectangular cross-section at least in that region where the reactant gases flow in. By this means, the same flow conditions are obtained over the cross-sectional dimensions of the substrates.

As rectangular tubes made of quartz-glass are not very sturdy under pressure diffences like those occuring during tube evacuation, a protective tube surrounding the reaction vessel is provided. This protective tube has a face-end reactant gas inlet which is connected to a flange element to which a flange element attached to the reaction vessel can be flanged. By this means, there is a smooth flow channel from the flange of the protective tube into the interior of the reaction vessel, in which, if required, the adaption of the round cross-section of the flange to the rectangular cross-section of the reaction vessel in the substrates can take place without dead volume occuring which would prevent rapid "switching" of different reactant gases.

In order to facilitate handling as well as production and, in particular, also to reduce the danger of glass breakage due to differences in temperature, the reaction vessel is firmly connected with the protective tube only on one side. To prevent reactant gases from escaping in such a construction from the reaction vessel and precipitating on the (colder) wall of the protective tube, a purging of the intermediate space reaction vessel/protective tube is provided. For this purpose, there is a protective gas inlet at the superficies, which permits purging the space between the reaction vessel and the protective tube, and a reactant gas outlet. The reactant gases are deflected in the reaction vessel and exit via an opening in the reactant vessel corresponding to the reactant gas outlet. The diffusion barrier provided at the end of the reaction vessel opposite the gas-entrance-side end prevents the reactant gases from escaping into the protective tube. In an embodiment of the invention a substrate support is constructed in such a manner that the substrates are arranged in the same plane as the wall flange elements. By this means, it is ensured that no vorticies can occur over the longitudinal dimensions of the substrates due to changes in the flow conditions.

In an embodiment of the invention, in which the substrate support only extends over a part of the length of the reaction vessel and a compensation element extending to the end opposite the entrance-side end of the reaction vessel is provided adjunct to the substrate support.

In certain embodiments of the invention, means are provided by which, the flow is directed through the interior of the reaction vessel free of turbulences and, on the other hand, the reactant gases are prevented from escaping into the protective tube.

In an embodiment of the invention in which the protective tube is also made of quartz-glass and the (gastight) connection between the protective tube and the reaction vessel occurs by means of glass grinding pits, it is ensured, that the grinding pits are pressed into each other as the ram pushed by the outer pressure moves the reaction glass in a direction in which the grinding pits are pressed into each other.

The invented MOCVD can preferably be employed for producing III-V- or II-VI mixed crystals at high gas velocities of up to 20 m/sec and/or low pressure between 10 and 1000 mbar. In particular, it can be used for TMGa, TMIn systems with MO doping and/or AsHT3T, PHT3T doping. The produced layer systems are extremely uniform, and by avoiding dead volume, "sharp" layer sequences are yielded.

BRIEF DESCRIPTION OF THE DRAWINGS

The present invention is made more apparent in the following section using a preferred embodiment with reference to the accompanying drawing, in which.

DESCRIPTION OF A PREFERRED EMBODIMENT

Figure 1:
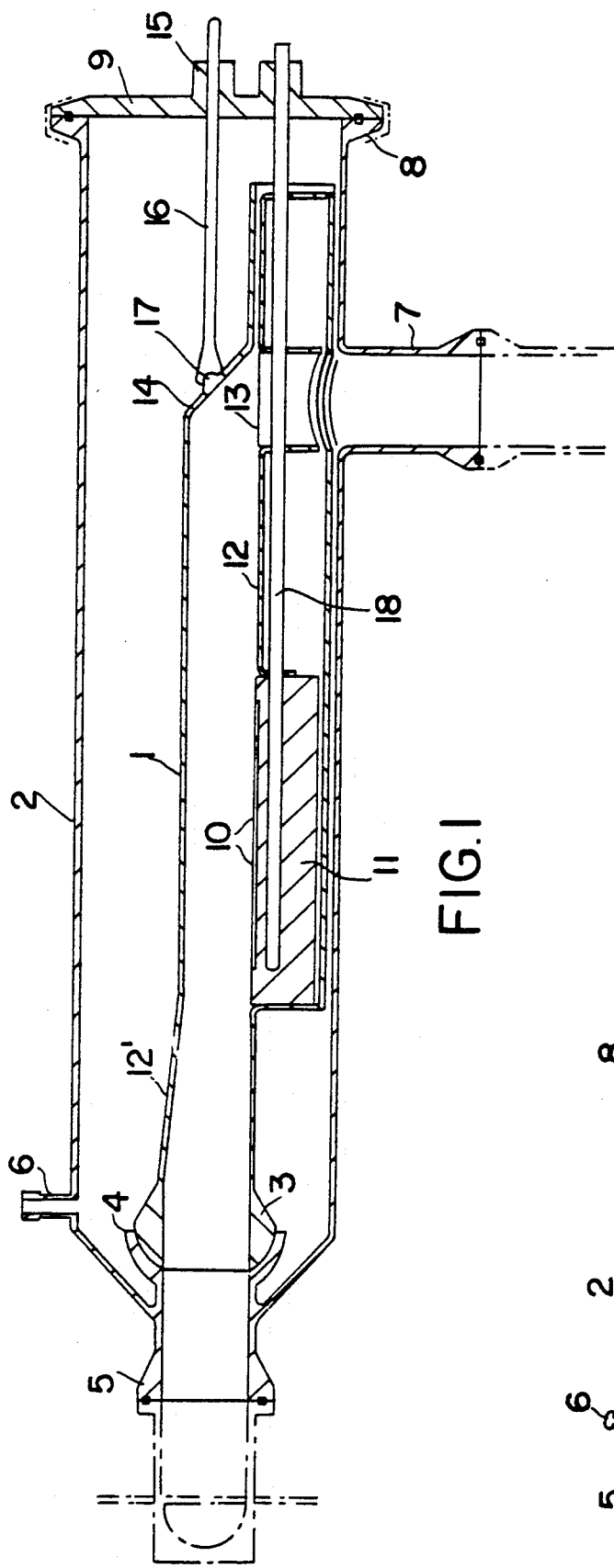
FIG. 1 shows a cross-section of the preferred embodiment.

The invented MOCVD reactor illustrated in the figures is provided with an actual reaction vessel 1 which is inserted into a protective tube 2. For this purpose both tubes, which are made of quartz-glass in the illustrated preferred embodiment, are provided with grinding pits 3 or 4, which produce a gas-tight connection. Furthermore, the protective tube 2 has a face-end flange 5 serving as a reactant gas inlet from a gas-supply unit, not illustrated herein, and a protective gas inlet 6 and a reactant gas outlet 7 in its cylindrical surface.

The face end of the protective tube 2 opposite flange 5 is also provided with a flange 8, which permits unimpeded insertion of reaction vessel 1 into the protective tube 2 and can be closed with a flange plate 9.

Figure 2:
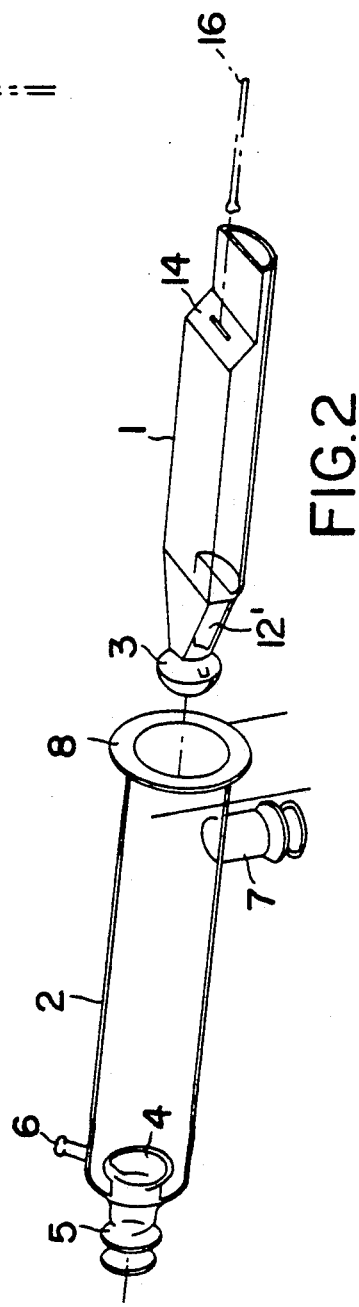
FIG. 2 shows a perspective view of the preferred embodiment.

The reaction vessel 1 has in the region, in which substrates 10 are arranged on a substrate support 11, in the lower part of the cross-section a round and the in upper part of the cross-section a rectangular shape (FIG. 2). By this means, it is ensured that the flow conditions over the substrates 10 are uniform perpendicular to the flow direction. The widening of the round inlet opening of the flange or grinding pit 3 to the rectangular shape of the flow channel takes place, as is evident from FIG. 2, in a continuous manner in section 12' so that no dead volumes, etc. can occur.

Furthermore, in accordance with the present invention substrates 10 are provided only in the midsection of the reaction vessel 1, in the rear part of which where the flow is deflected, and thus, constant flow conditions are no longer given, is a compensation element 12 provided, which terminates "flush" with the substrate surface.

In the compensation element 12, there is an opening 13 corresponding to the reactant gas outlet 7 in such a way that the reactant gas entering through flange 5 can be removed again. Also, a rod 18 is used to position the substrate carrier 11 in the reaction vessel 1.

The cross-section of the reaction vessel decreases in the rear part to dimensions which are negligibly larger than the dimensions of the substrate support 11 or the compensation element 12. As protective gas is introduced into the space between the protective tube 2 and the reaction vessel 1, this design of the rear part of the reaction vessel forms a diffusion barrier without necessitating a gas-tight connection at the rear end between the protective tube and the reaction vessel.

This diffusion barrier effect is additionally supported by the arrangement of an approximately 45 degree inclined plane surface 14 above the opening 13. The plane surface 14 serves as an "impact plate" for the rapid reactant gas flow.

By this means, the reactant gas is prevented from escaping elsewhere than at opening 13 or flange 7 and precipitating in the protective tube.

The flange plate 9 is provided with a pressure-type coupling 15, into which ram 16 is inserted, which rests on a nose 17 on the surface 14. The ram 16 is pushed by the pressure difference between the outer pressure and the inner pressure in the direction of the reactant vessel and thus presses the flanges 3 and 4 together in such a way that a gas-tight connection is ensured.

The reaction vessel illustrated in the figures has typical dimensions with a length of 45 cm and a diameter of 90 mm so that at least two 2" wafers can be worked on simultaneously.

In the preceding section, the present invention is described using a preferred embodiment without any intention of limiting the spirit or scope of the overall inventive concept within which there are, of course, many most varied possible deviations: by way of illustration, other dimensions and/or materials may be used.

In any event, however, the result is a reactor which permits, by means of the rectangular shape of the flow channel, uniform layer production at high flow velocities up to 20 m/sec and low pressure between approx. 10 and 1000 mbar. The stability of the reaction vessel is ensured by the outer protective tube, the soiling of which is minimized by the protective gas purging. The entire construction without dead volumes makes it possible to change the type of gas and/or dopant in such a manner that "sharp" layer boundaries are yielded.

What I claim is:

1. A reactor for MOCVD systems consisting essentially of:
    a reaction vessel through which reactant gas or gases flow and in which substrates are arranged in such a manner that a main surface is approximately parallel to the flow direction, said reaction vessel being made of quartz-glass and having a rectangular cross-section in the region in which the reactant gas flows and a flange element provided at a gas-entrance-side end of the reaction vessel, said reaction vessel having a round cross-section at the flange element, said round cross-section continuously widening in the flow direction to said rectangular cross-section;
    a protective tube surrounding said reaction vessel, said protective tube having a face-end reactant gas inlet and a flange element connected with the reactant gas inlet, said flange element of the protective tube being flanged with said flange element of the reaction vessel, said protective tube also having on its superficies a protective gas inlet and a reactant gas outlet which permits purging the space between said reaction vessel and said protective tube;
    means for deflecting the reactant gases in the reaction vessel to exit through the superficies of the reaction vessel; and
    a diffusion barrier provided at the end of the reaction vessel opposite the gas-entrance-side end of the reaction vessel.

2. A reactor according to claim 1, wherein a substrate support is constructed in such a manner that the substrates are arranged in a plane of an interior wall of said flange elements.

3. A reactor according to claim 2, wherein said substrate support extends only over a part of the length of said reaction vessel and a compensation element extending to said end opposite said gas-entrance side end of said reaction vessel is provided adjunct to said substrate support.

4. A reactor according to claim 3, wherein an opening connecting the interior of said reaction vessel with said reactant gas outlet in said superficies of said protective tube is provided in said compensation element.

5. A reactor according to claim 3 wherein said reaction vessel tapers down to the cross-section of said compensation element in order to form a diffusion barrier.

6. A reactor according to claim 5, wherein said reaction vessel has, in the region of said cross-section tapering, a plane boundary wall section which is provided above said opening in said compensation element.

7. A reactor according to claim 6, wherein said protective tube is provided, at its face surface opposite said reactant gas inlet, with a flange which can be connected to a cover plate into which a ram can be inserted with rests on said plane boundary wall section of said reaction vessel.

8. A reactor according to claim 1, wherein said protective tube is also made of quartz-glass and said reaction vessel is connected to said protective tube by means of a grinding pit connection.

9. A reactor according to claim 4, wherein said reaction vessel tapers down to the cross section of said compensation element in order to form a diffusion barrier.

10. A reactor according to claim 3, wherein said protective tube is also made of quartz-glass and said reaction vessel is connected to said protective tube by means of a grinding pit connection.

11. A reactor according to claim 1, wherein the rectangular cross-section is constant such that flow conditions over the substrates are uniform perpendicular to the flow direction.

* * * * *